(12) United States Patent
Furukawa et al.

(10) Patent No.: US 8,378,674 B2
(45) Date of Patent: Feb. 19, 2013

(54) MAGNETIC FIELD DETECTION DEVICE

(75) Inventors: Taisuke Furukawa, Tokyo (JP);
Takeharu Kuroiwa, Tokyo (JP); Shingo Tomohisa, Tokyo (JP); Takashi Takenaga, Tokyo (JP); Masakazu Taki, Tokyo (JP); Hiroshi Takada, Tokyo (JP); Yuji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 525 days.

(21) Appl. No.: 12/601,098

(22) PCT Filed: May 27, 2008

(86) PCT No.: PCT/JP2008/059710
§ 371 (c)(1),
(2), (4) Date: Nov. 20, 2009

(87) PCT Pub. No.: WO2008/146809
PCT Pub. Date: Dec. 4, 2008

(65) Prior Publication Data
US 2010/0156405 A1 Jun. 24, 2010

(30) Foreign Application Priority Data
May 28, 2007 (JP) ................................ 2007-0139850

(51) Int. Cl.
*G01R 33/02* (2006.01)
(52) U.S. Cl. ...................... 324/252; 324/251; 324/207.2; 324/207.21
(58) Field of Classification Search ............... 324/207.2, 324/207.21, 252, 251
See application file for complete search history.

(56) References Cited

U.S. PATENT DOCUMENTS

| | | | |
|---|---|---|---|
| 5,206,590 | A | 4/1993 | Dieny et al. |
| 7,046,002 | B1 * | 5/2006 | Edelstein ................. 324/244 |
| 2007/0047152 | A1 | 3/2007 | Furukawa et al. |
| 2008/0012558 | A1 * | 1/2008 | Rossler et al. ............. 324/252 |

FOREIGN PATENT DOCUMENTS

| | | |
|---|---|---|
| JP | 8 21166 | 3/1996 |
| JP | 9 218052 | 8/1997 |
| JP | 10 318783 | 12/1998 |
| JP | 2000 193728 | 7/2000 |
| JP | 2001 102659 | 4/2001 |
| JP | 2005 331296 | 12/2005 |

* cited by examiner

*Primary Examiner* — Bot LeDynh
*Assistant Examiner* — Son Le
(74) *Attorney, Agent, or Firm* — Oblon, Spivak, McClelland, Maier & Neustadt, L.L.P.

(57) ABSTRACT

A magnetic field detection device including a magnetic body (magnetic flux guide) provided for adjusting a magnetic field to be applied to a magneto-resistance element. A shape of an on-substrate magnetic body in plan view is a tapered shape on one end portion side and a substantially funnel shape on another end portion side opposite the one end portion, the another end portion being larger in width than the one end portion, and a magneto-resistance element is disposed in front of an output-side end portion. In the on-substrate magnetic body, a contour of a tapered portion is not linear like a funnel, but has a curved shape in which a first curved portion protruding outward with a gentle curvature and a second curved portion protruding inward with a curvature similar to that of the first curved portion are continuously formed.

2 Claims, 12 Drawing Sheets

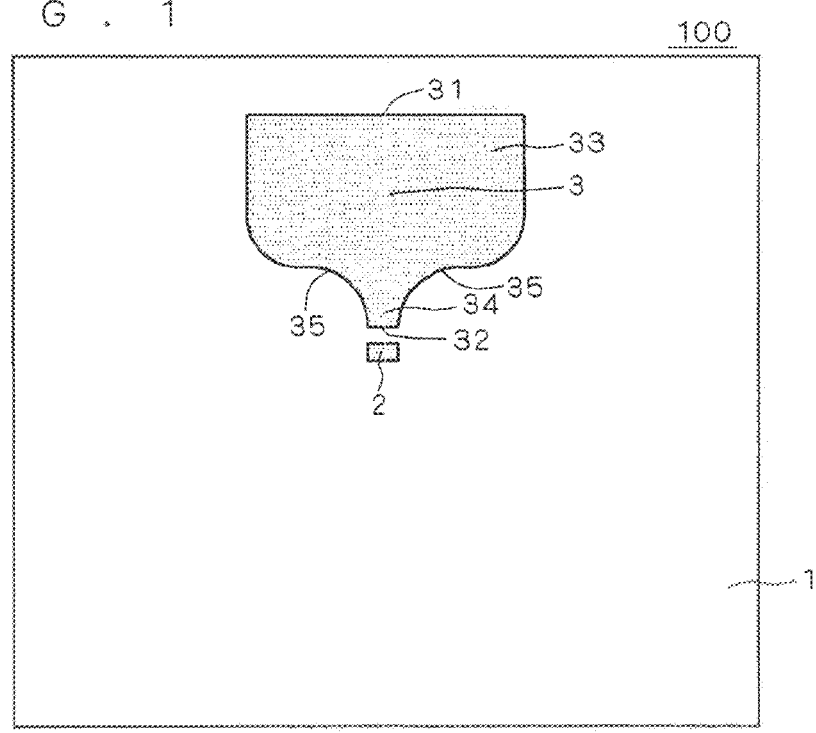
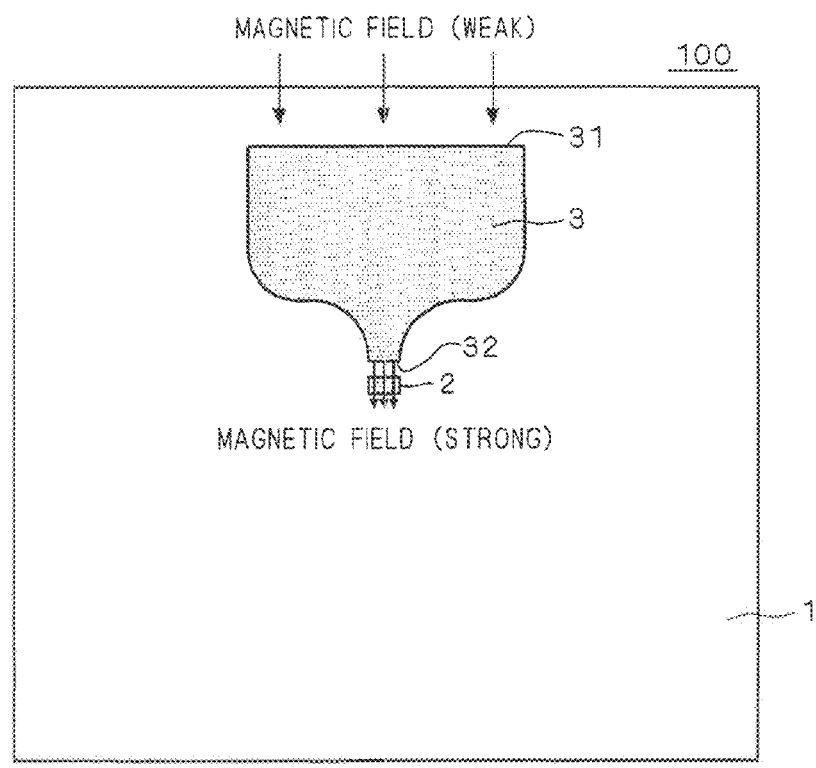

FIG. 3

| SECOND FERROMAGNETIC LAYER (FREE LAYER) | —14 |
|---|---|
| FIRST NON-MAGNETIC LAYER | —13 |
| FIRST FERROMAGNETIC LAYER (FIXED LAYER) | —12 |
| ANTI-FERROMAGNETIC LAYER | —11 |

FIG. 4

| SECOND FERROMAGNETIC LAYER (FREE LAYER) | —14 | |
|---|---|---|
| FIRST NON-MAGNETIC LAYER | —13 | |
| THIRD FERROMAGNETIC LAYER (FIXED LAYER) | —16 | |
| SECOND NON-MAGNETIC LAYER | —15 | PL |
| FIRST FERROMAGNETIC LAYER (FIXED LAYER) | —12 | |
| ANTI-FERROMAGNETIC LAYER | —11 | |

F I G . 6
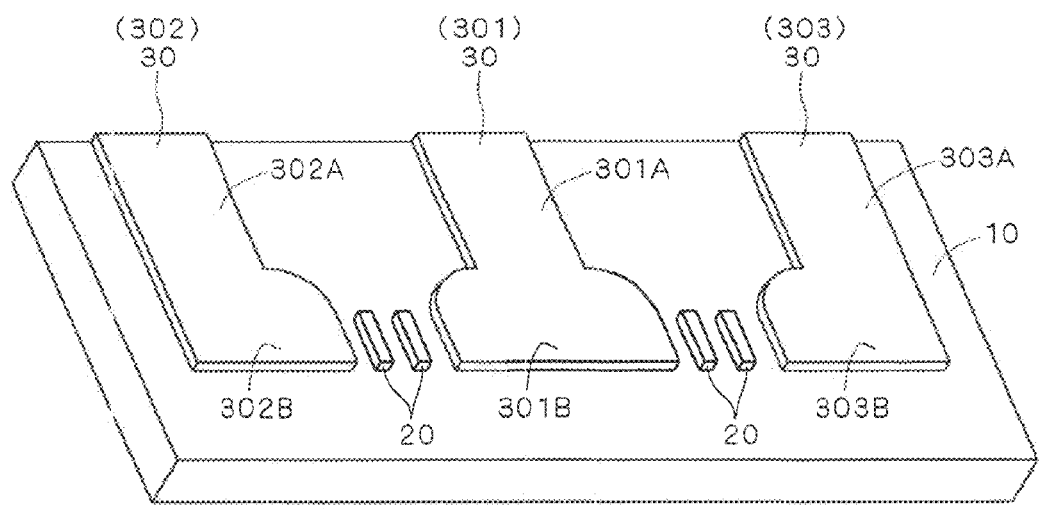
F I G . 7
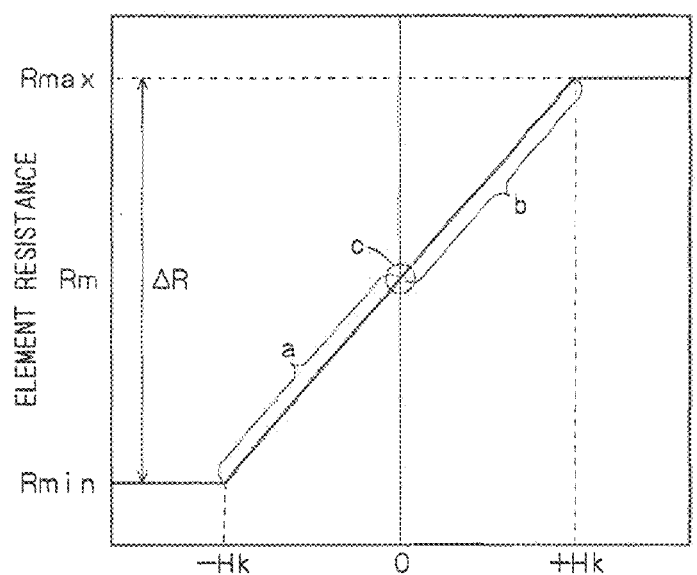

F I G . 8
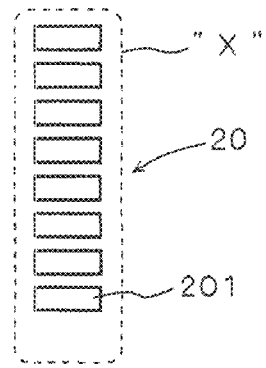
F I G . 9
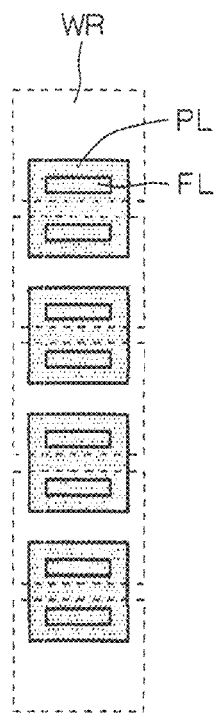

MAGNETIC FIELD DETECTION DEVICE

TECHNICAL FIELD

The present invention relates to a magnetic field detection device, and more particularly, to a magnetic field detection device using a magneto-resistance element.

BACKGROUND ART

In a magnetic field detection device which outputs a detection signal corresponding to a magnetic field (external magnetic field) applied from an outside thereof, there is known, as a detecting element, a magneto-resistance element using a magneto-resistance effect of a magnetic material in addition to a Hall element using a Hall effect of a semiconductor. As the magneto-resistance element, there are known an anisotropic magneto-resistance (AMR) element using an anisotropic magneto-resistance effect of metal, a giant magneto-resistance (GMR) element using a giant magneto-resistance effect, a tunnel magneto-resistance (TMR) effect using a tunnel magneto-resistance effect, and the like. An SN ratio of the magnetic field detection device is improved as an output of a magnetic field detection element with respect to the external magnetic field increases, and hence attention is focused on a magnetic field detection device using the GMR element or the TMR element by which a larger output can be obtained.

As a basic structure of the GMR element or the TMR element, there is known, for example, a spin valve structure disclosed in Patent Document 1.

The spin valve structure is a structure in which a first anti-ferromagnetic layer, a first ferromagnetic layer, a first non-magnetic layer, and a second ferromagnetic layer are stacked. In a magneto-resistance element which has the spin valve structure, a magnetization direction of the first ferromagnetic layer is fixed to one direction owing to an exchange-coupling magnetic field with the anti-ferromagnetic layer, and thus the first ferromagnetic layer is referred to as a fixed layer. On the other hand, a direction of a magnetic field of the second ferromagnetic layer is freely rotated owing to the external magnetic field, and thus the second ferromagnetic layer is referred to as a free layer. A resistance of the magneto-resistance element which has the spin valve structure changes in accordance with an angle formed by magnetization vectors of the fixed layer and the free layer. That is, a resistance value of the element changes through a change in magnetization direction of the free layer owing to the external magnetic field, whereby it is possible to detect a direction of the external magnetic field by detecting a change in resistance value of the element.

Here, in the TMR element, an insulating material such as AlOx or MgO is used for the first non-magnetic layer to detect a change in current flowing in a direction perpendicular to a main surface of a layer, and in the GMR element, a conductive material such as copper (Cu) or ruthenium (Ru) is used for the first non-magnetic layer to detect a change in current flowing in a direction parallel to the main surface of the layer.

Magnetization directions of the fixed layer and the free layer are caused to be substantially perpendicular to each other when the external magnetic field is not applied, whereby it is possible to form the TMR element and the GMR element capable of obtaining a linear output with respect to the external magnetic field.

Further, as a conventional magnetic field detection device, there is known, for example, a rotation sensor using a magneto-resistance element as described in Patent Document 2.

Patent Document 1: Japanese Patent Publication No. 08-21166 (1996)
Patent Document 2: Japanese Patent Application Laid-Open No. 2005-331296

In the conventional magnetic field detection device described above, a magnetic body is provided at a position apart from the magneto-resistance element for adjusting a magnetic field applied to the magneto-resistance element. However, the magnetic field applied to the magneto-resistance element greatly depends on an arrangement of the magnetic body, which causes a problem that, even in a case where the arrangement of the magnetic body is slightly deviated from an original position, the magnetic field is greatly affected.

Particularly in a case where the magneto-resistance element is downsized or in a case where the magnetic field detection device itself is downsized, there is a problem that an allowance for arrangement deviation of the magnetic body is reduced, and thus an error in detection value of the magnetic field detection device is increased, leading to a decrease in yield when the magnetic field detection device is manufactured.

DISCLOSURE OF INVENTION

The present invention has been made in order to solve the above-mentioned problems, and therefore an object thereof is to provide a magnetic field detection device including a magnetic body (magnetic flux guide) provided for adjusting a magnetic field applied to a magneto-resistance element, which has a few detection errors resulting from positional variations of the magnetic flux guide.

The magnetic field detection device according to the present invention includes: a substrate; at least one magneto-resistance element provided on one main surface of the substrate; and at least one on-substrate magnetic body which is provided on the one main surface or another main surface of the substrate and is electrically insulated from the magneto-resistance element, wherein: the on-substrate magnetic body has an area of an outputting portion which is set to be smaller than an area of an entering portion of a magnetic field, and converges the magnetic field entering from the entering portion to output the magnetic field from the outputting portion; and the magneto-resistance element is disposed apart from the outputting portion on the outputting portion side.

According to the magnetic field detection device of the present invention, since the magneto-resistance element is disposed on the outputting portion side while being isolated from the outputting portion, the magneto-resistance element can be applied with the magnetic field stronger than the external magnetic field, whereby the sensitivity of the magnetic field detection device can be increased. Further, since the on-substrate magnetic body is disposed on the same substrate on which the magneto-resistance element is disposed, the on-substrate magnetic body can be disposed while maintaining high-accurate positional relationship with the magneto-resistance element when being formed, for example, using photolithography. As a result, it is possible to prevent a decrease in yield, which results from variations in arrangement position of the on-substrate magnetic body. Still further, in a case where the magneto-resistance element and the on-substrate magnetic body are individually disposed on different main surfaces of the substrate, they can be easily disposed in parallel to the main surfaces of the substrate with a distance determined by a thickness of the substrate. Also in this case, it is possible to prevent a decrease in yield, which results from variations in arrangement position of the on-substrate magnetic body.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a view showing a structure of a magnetic field detection device according to a first embodiment of the present invention.

FIG. 2 is another view showing the structure of the magnetic field detection device according to the first embodiment of the present invention.

FIG. 3 is a cross-sectional view showing a structure of a TMR element.

FIG. 4 is another cross-sectional view showing the structure of the TMR element.

FIG. 6 is a perspective view showing a structure of a substrate of the magnetic field detection device according to the second embodiment of the present invention.

FIG. 7 is a graph showing a resistance characteristic of the TMR element which is arranged so that magnetization directions of a free layer and a fixed layer are orthogonal to each other.

FIG. 8 is a plan view showing a structure of a magneto-resistance element in which a plurality of more minute magneto-resistance elements are connected in series.

FIG. 9 is a view showing a relationship between a free layer, a fixed layer, and a wiring layer of the magneto-resistance element in which the plurality of more minute magneto-resistance elements are connected in series.

BEST MODE FOR CARRYING OUT THE INVENTION

A. First Embodiment

A-1. Device Structure

Figure 5:
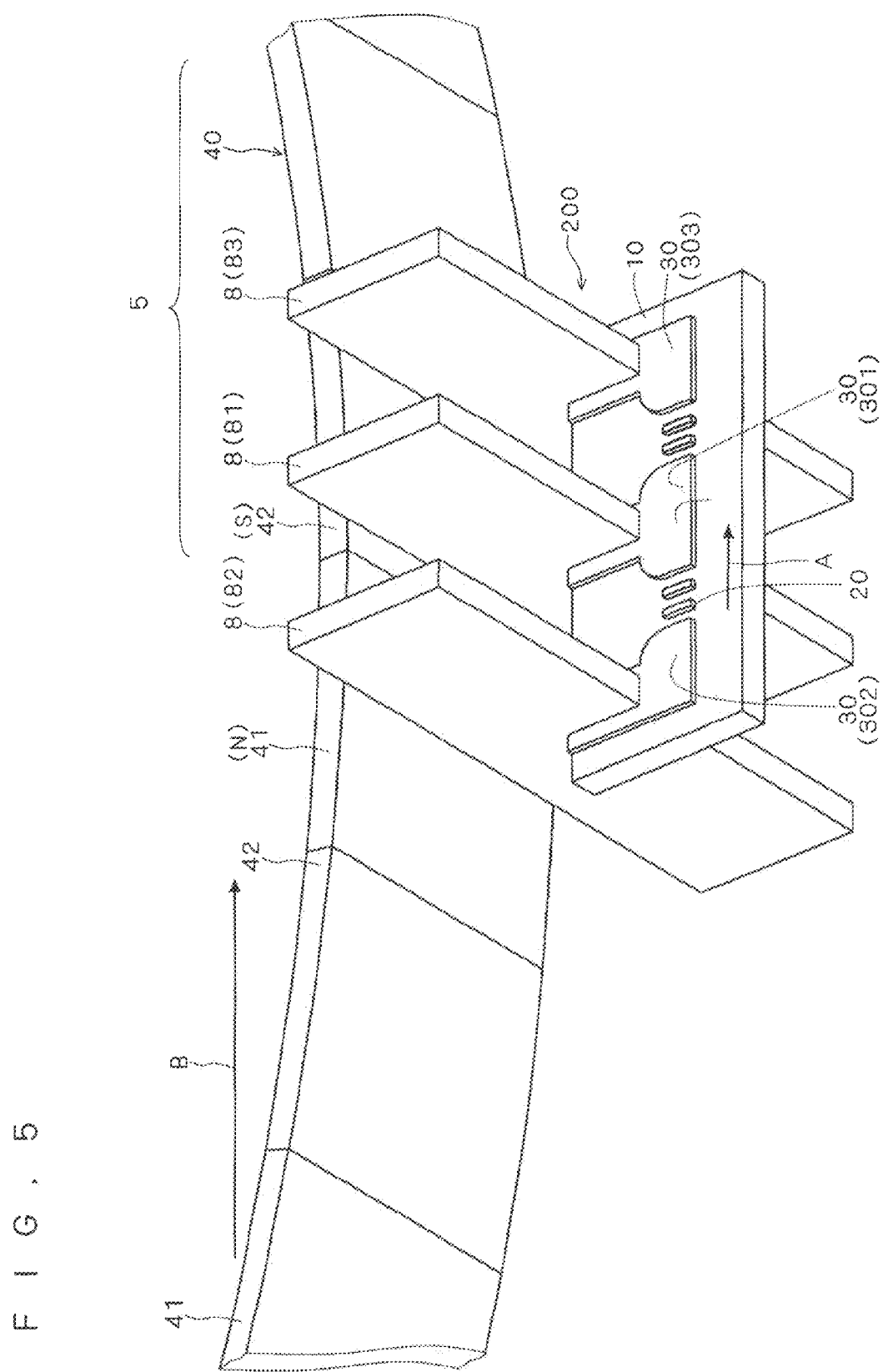
FIG. 5 is a perspective view showing a structure of a magnetic field detection device according to a second embodiment of the present invention.

FIG. 1 shows a structure of a magnetic field detection device 100 according to a first embodiment of the present invention. FIG. 1 is a plan view of a substrate 1, in which a magneto-resistance element 2 and an on-substrate magnetic body 3 which form the magnetic field detection device 100 are disposed, viewed from above a main surface thereof.

As shown in FIG. 1, a shape of the on-substrate magnetic body 3 in plan view is a tapered shape on one end portion (referred to as output-side end portion) 32 side and is a substantially funnel shape in which the other end portion (referred to as input-side end portion) 31 is larger in width than the one end on the other end portion side opposite to the one end portion. The magneto-resistance element 2 is disposed in front of the output-side end portion.

The reason why the shape of the on-substrate magnetic body 3 is referred to as the substantially funnel shape is that a contour of a tapered portion 34 between a main body part 33 and the output-side end portion 32 is not linear as in the case of a funnel, but has a curved shape in which a first curved portion protruding outward with a gentle curvature and a second curved portion gently protruding inward with a curvature similar to that of the first curved portion are continuously formed. Accordingly, the tapered portion 34 has a shape of significantly narrowing in the vicinity of the output-side end portion 32.

A-2. Device Operation

In the on-substrate magnetic body 3 having the above-mentioned shape, as shown in FIG. 2, when the magnetic field enters from the input-side end portion 31 side, the magnetic field is guided through the on-substrate magnetic body 3 in accordance with a shape in plan view to converge on the tapered portion 34, and then is output from the output-side end portion 32 with a magnetic flux density higher than a magnetic flux density on the input-side end portion 31 side. The on-substrate magnetic body 3 can be referred to as a magnetic flux guide in terms of a function thereof.

The magnetic field detection device 100 is disposed so that the magnetic field enters perpendicularly to the input-side end portion 31 of the on-substrate magnetic body 3, and thus the magnetic field enters the on-substrate magnetic body 3 from the input-side end portion 31 and is emitted from the output-side end portion 32. With the magnetic flux density on an end surface of the output-side end portion 32, there can be generally obtained a convergence effect obtained by (an area of an end surface of the input-side end portion 31/(an area of the end surface of the output-side end portion 32). Accordingly, the magnetic field stronger than the external magnetic field can be applied to the magneto-resistance element 2 when the magneto-resistance element 2 is disposed in the vicinity of the output-side end portion 32, and hence the sensitivity of the magnetic field detection device 100 can be increased. In addition, the magneto-resistance element 2 can be effectively shielded from the external magnetic field when the magneto-resistance element 2 is disposed in the vicinity of the on-substrate magnetic body 3, and hence the external magnetic field can be suppressed from being directly applied to the magneto-resistance element 2.

Note that an optimum width ratio between a width of the input-side end portion 31 and a width of the output-side end portion 32 is determined based on a strength of the magnetic field to be detected and a saturation magnetic flux density of the on-substrate magnetic body 3. That is, the on-substrate magnetic body 3 needs not to be magnetically saturated even in a case where the maximum value of the magnetic field to be detected is applied. For example, in the on-substrate magnetic body 3 which has a saturation magnetic flux density of 1 tesla, the magnetic flux density to be applied to the input-side end portion 31 is desirably equal to or less than 0.01 tesla in a case where the ratio between the width of the input-side end portion 31 and the width of the output-side end portion 32 is 100 times.

Further, the on-substrate magnetic body 3 is disposed on the same substrate 1 on which the magneto-resistance element 2 is disposed. Accordingly, when the on-substrate magnetic body 3 is formed using, for example, photolithography, it is possible to dispose the on-substrate magnetic body 3 with respect to the magneto-resistance element 2 while maintaining a positional relationship therebetween with high accuracy. As a result, it is possible to prevent a decrease in yield, which results from variations in arrangement position of the on-substrate magnetic body 3.

Note that the reason why the shape of the on-substrate magnetic body 3 in plan view is made to be a substantially funnel shape is that, in a case where the tapered portion 34 has a linear shape as a funnel, a bent portion thereof has an edge, and a distribution of the magnetic field (change amount in a magnetic field direction due to a position thereof) is increased in the edge, whereby the edge is more easily affected by the positional deviation. Note that as long as there occurs no problem when the on-substrate magnetic body 3 is affected by the edge, the on-substrate magnetic body 3 may have a funnel shape or a shape of a triangle with its apex angle being cut.

A-3. Manufacturing Method

Next, a manufacturing method for each structure of the magnetic field detection device 100 is described with reference to FIG. 1 to FIG. 4.

(A-3-1. Structure of On-Substrate Magnetic Body and Manufacturing Method Therefor)

A material for the on-substrate magnetic body 3 is not particularly limited as long as the material has high magnetic permeability, and for example, may be formed of iron (Fe), cobalt (Co), nickel (Ni), or an alloy thereof.

The on-substrate magnetic body 3, that is, the magnetic flux guide can be formed in the following process.

First, a thin film made of a magnetic material is formed on the substrate 1 by any of, for example, vapor deposition method, a magnetron sputtering method, and a plating method. The on-substrate magnetic body 3 is desirably deposited thicker compared with the magneto-resistance element 2 so as to allow a sufficient amount of magnetic flux to pass therethrough. For example, a magnetic film having a thickness of 1 µm is deposited. As the substrate 1, preferably, an insulating film such as a silicon thermal oxidation film is deposited on a silicon monocrystalline substrate in terms of high flatness. However, as long as the flatness is ensured, there may be used a ceramic substrate or a glass substrate, or even, for example, a substrate made of a resin such as a printed circuit board.

Next, the deposited magnetic film is patterned by a method such as photolithography. That is, for example, a photoresist is spin-coated on a main surface of the substrate 1 on which the magnetic film is entirely deposited, and then exposure is performed so as to obtain a desired mask shape using an exposure device such as a stepper and an aligner. Then, a mask (photomask) formed of a photoresist is formed on the main surface of the substrate 1 through development process performed thereafter.

Then, based on the prepared photomask, etching is performed by, for example, ion milling or a wet process using mixed acid, whereby the magnetic flux guide having a desired shape can be formed.

Alternatively, as the other manufacturing method, the pattern may be formed by applying onto the substrate 1 a magnetic body paste obtained by, for example, mixing a powder of Fe, Co, Ni, or an alloy thereof into a resin, and then performing patterning, or by performing printing using the magnetic body paste. Still alternatively, the pattern may be formed by a method of spraying the magnetic body paste onto the substrate 1 to be cured as in the case of an inkjet printer.

The magnetic field exerted on the magneto-resistance element 2 by the on-substrate magnetic body 3 is proportional to a magnetization amount of the on-substrate magnetic body 3 and is inversely proportional to a square of a distance between the on-substrate magnetic body 3 and the magneto-resistance element 2. Therefore, in order to reduce variations in strength of the magnetic field applied to the magneto-resistance element 2, it is important to improve positional accuracy of a portion of the on-substrate magnetic body 3, which is most adjacent to the magneto-resistance element 2.

For example, in a case where the on-substrate magnetic body 3 manufactured by wire cut or punching is assembled onto the substrate 1, according to general machining accuracy, a dimension of the on-substrate magnetic body 3 has a tolerance of approximately 0.1 mm, and accuracy in assembling has a similar level of tolerance as well. Accordingly, it is difficult to improve the positional accuracy.

Meanwhile, as described above, in the case where the magnetic film is deposited on the substrate 1 and is patterned by the method such as photolithography, an alignment mark is formed, using a mask for patterning the magneto-resistance element 2, on the substrate 1 at the same time with the magneto-resistance element 2 with the use of, for example, a contact aligner or a g-line stepper. After that, there is employed a technique of superimposing a mask for patterning the on-substrate magnetic body 3 on the substrate 1 with the alignment mark being as a reference. As a result, a distance between the magneto-resistance element 2 and the on-substrate magnetic body 3 can be easily controlled with accuracy of ±1 µm. Also as to dimensional accuracy of the on-substrate magnetic body 3, manufacturing can be facilitated with an error of approximately 1 µm.

Further, as described above, also in the case where printing of the magnetic body paste or the patterning by spraying the magnetic body paste is adopted, it is possible to perform alignment with high accuracy by adopting a technique of forming, using the mask for patterning the magneto-resistance element 2, the alignment mark on the substrate at the same time with the magneto-resistance element 2, and performing alignment of a printing position on the substrate 1 and a spraying position with the alignment mark being as a reference.

More preferably, the on-substrate magnetic body 3 may be formed with higher accuracy than the magneto-resistance element 2 by patterning a thin magnetic body film with high accuracy by the above-mentioned method employing photolithography, and then using the thin magnetic body film as a seed layer to form a thick magnetic body film only on the seed layer by plating.

Those techniques can be easily realized only when the on-substrate magnetic body 3 is formed on the same substrate 1 on which the magneto-resistance element 2 is formed.

(A-3-2. Structure of Magneto-Resistance Element and Manufacturing Method Therefor)

The magneto-resistance element 2 desirably has a configuration so as to detect the magnetic field of the substrate 1 in an in-plane direction (direction parallel to the main surface), and preferably is, for example, a spin-valve type TMR element, GMR element, or MR element. The TMR element capable of reducing an element size thereof is particularly suitable.

FIG. 3 shows an example of a configuration of the TMR element having a spin-valve configuration.

The TMR element shown in FIG. 3 includes: an anti-ferromagnetic layer 11; a first ferromagnetic layer 12 which is provided in contact with a main surface of the anti-ferromagnetic layer 11; a first non-magnetic layer 13 which is provided in contact with a main surface on a side of the first ferromagnetic layer 12, the side being opposite to a side which is in contact with the anti-ferromagnetic layer 11; and a second ferromagnetic layer 14 which is provided in contact with a main surface on a side of the first non-magnetic layer 13, the side being opposite to a side which is in contact with the first ferromagnetic layer 12.

In the magneto-resistance element having a spin-valve configuration, a magnetization direction of the first ferromagnetic layer 12 is fixed to one direction owing to an exchange-coupling magnetic field with the anti-ferromagnetic layer, and thus the first ferromagnetic layer 12 is referred to as a fixed layer. On the other hand, a direction of the magnetic field of the second ferromagnetic layer freely rotates due to the external magnetic field, and thus the second ferromagnetic layer is referred to as a free layer.

A resistance of the magneto-resistance element having the spin-valve configuration changes in accordance with an angle formed by magnetization vectors of the fixed layer and the free layer. That is, a current which tunnels through the first non-magnetic layer 13 serving as a tunnel insulating layer differs between in a case where directions of the magnetization vectors of the fixed layer and the free layer are equal to each other and in a case where the directions thereof are different from each other. For this reason, it is possible to detect a change in magnetization direction of the free layer due to the external magnetic field as a change in resistance value of the magneto-resistance element.

Alternatively, a structure as shown in FIG. 4 is conceivable as the TMR element. That is, there can be adopted a so-called synthesis anti-ferroelectrics (SAF) configuration in which a second anti-magnetic layer 15 and a third ferromagnetic layer 16 are stacked 13 in the stated order between the first ferromagnetic layer 12 and the first non-magnetic layer 13 which are shown in FIG. 2.

In this case, the first ferromagnetic layer 12, the second non-magnetic layer 15, and the third ferromagnetic layer 16 are collectively referred to as a fixed layer, and the magnetization of the fixed layer effectively becomes zero. Accordingly, there is a feature that the magnetization direction of the fixed layer becomes stable even in a case where a strong magnetic field is applied in a direction perpendicular to the magnetization direction of the fixed layer.

Here, a material for the anti-ferromagnetic layer 11 includes IrMn, a material for the first ferromagnetic layer 12 includes NiFe and CoFe, a material for the first non-magnetic layer (tunnel insulating layer) 13 includes AlOx, and a material for the second ferromagnetic layer 14 includes NiFe.

The above is merely an example, and besides, the material for the anti-ferromagnetic layer includes FeMn and PtMn, and the material for the ferromagnetic layer includes metal containing Co, Fe, CoFe alloy, CoNi alloy, metal containing Co, Ni, and Fe as a main component, and an alloy of NiMnSb or $Co_2MnGe$. Even though the material is one other than described above, there is no particular limitation as long as the material is capable of obtaining desired performance as the TMR element.

In addition, the first non-magnetic layer 13 serving as the tunnel insulating layer may be formed of any material as long as the material is an insulator, and includes, for example, an oxide of metal such as $Ta_2O_5$, $SiO_2$, and MgO. The material may be a fluoride. Moreover, in the TMR element having the SAF configuration which is shown in FIG. 4, a non-magnetic material such as Ru and Cu can be used as the second non-magnetic layer 15.

The above-mentioned respective layers can be formed by, for example, DC magnetron sputtering. In addition, the respective layers may be formed by, for example, a molecular beam epitaxy (MBE) method, various types of sputtering methods, a chemical vapor deposition (CVD) method, and an evaporation method.

Patterning of the respective layers of the TMR element is performed by, for example, photolithography. In this case, films serving as the free layer, the tunnel insulating layer, and the fixed layer are individually formed, and then, a desired mask pattern is formed by a photoresist. After that, a portion which is not covered with the mask is removed by ion milling or reactive ion etching, whereby it is possible to obtain a desired shape.

As a procedure of processing the TMR element in a thickness direction thereof, for example, the whole of the free layer and the tunnel insulating layer and a part of the fixed layer are removed in the thickness direction in the first processing, and then, a remaining fixed layer is removed in the second processing, with the result that the fixed layer and the free layer can be caused to serve as a lower electrode and an upper electrode, respectively. Note that the pattern may be formed by electron-beam lithography or lithography using a focused ion beam.

Further, a wiring layer (not shown) is formed above the upper electrode, and the wiring layer may be formed of, for example, an aluminum (Al) layer.

Note that though the method of forming the on-substrate magnetic body 3 has been described above, the on-substrate magnetic body 3 may be formed during the manufacturing process for the magneto-resistance element or may be formed by being stacked on the substrate 1 after, for example, the formation of the TMR element.

A power supply circuit, which applies a voltage between the upper electrode and the lower electrode, and a signal processing circuit, which detects a change in value of a current flowing due to a change in resistance value to output the resultant as a signal, are connected to the magneto-resistance element having the above-mentioned structure, whereby it is possible to take out an output corresponding to the magnetic field to be applied from an outside thereof.

Note that the spin-valve type TMR element and GMR element are magneto-resistance elements which detect a direction of the magnetic field to be applied to an inside of the surface on which the element is formed, and therefore have a feature that an effect of magnetic field control by the on-substrate magnetic body becomes more noticeable.

A-4. Modification

As to the magnetic field detection device 100 shown in FIG. 1, the example in which one magneto-resistance element 2 is disposed on the substrate 1 is described. However, there may be employed a structure in which a plurality of magneto-resistance elements 2 are disposed on the substrate 1, and the on-substrate magnetic bodies 3 are disposed in proximity to each thereof. For example, sets of the on-substrate magnetic body 3 and the magneto-resistance element 2, such as the magnetic field detection device 100 shown in FIG. 1, are disposed on the substrate 1 so that the directions of the input-side end portions 31 of the on-substrate magnetic bodies 3 indicate directions different from each other, whereby it is possible to obtain a magnetic field detection device capable of detecting the magnetic fields in a plurality of directions.

Further, the plurality of sets of the on-substrate magnetic body 3 and the magneto-resistance element 2 can be three-dimensionally disposed by being disposed on the respective substrates 1, not by being disposed on the same substrate 1. For example, the plurality of sets of the on-substrate magnetic body 3 and the magneto-resistance element 2 are arranged in three directions of X, Y, and Z, whereby there can be obtained a magnetic field detection device capable detecting respective magnetic fields in three directions.

Further, as to the magnetic field detection device 100 shown in FIG. 1, there is described the example in which the magneto-resistance element 2 and the on-substrate magnetic body 3 are provided on the same main surface of the substrate 1. However, the magneto-resistance element 2 and the on-substrate magnetic body 3 may be each disposed on the main surfaces of the substrate 1, which are different from each other. In this case, the on-substrate magnetic body 3 and the magneto-resistance element 2 can be easily disposed in parallel with the main surfaces of the substrate 1 with a distance determined in accordance with a thickness of the substrate 1. Here, control of the thickness of the substrate 1 with accuracy of approximately 0.01 mm can be easily performed with the use of a semiconductor substrate such as a silicon substrate. Accordingly, it is possible to set the distance between the magneto-resistance element 2 and the on-substrate magnetic body 3 with high accuracy.

Note that in a case where, for example, a transparent substrate such as glass is used as the substrate 1, in order to dispose the magneto-resistance element 2 and the on-substrate magnetic body 3 on the main surfaces of the substrate 1, which are different from each other, an alignment mark is formed, using a mask for patterning the magneto-resistance element 2, on one of the main surfaces of the substrate 1 at the same time with the magneto-resistance element 2 with the use of, for example, a g-line stepper. After that, there is employed a technique of superimposing the mask for patterning the on-substrate magnetic body 3 on the other main surface of the substrate 1 with the alignment mark being as a reference, which enables alignment with high accuracy. Alternatively, patterning may be performed using a double-sided aligner.

B. Second Embodiment

B-1. Device Structure

FIG. 5 shows a structure of a magnetic field detection device 200 according to a second embodiment of the present invention. The magnetic field detection device 100 according to the first embodiment, which is shown in FIG. 1, has the structure in which the magneto-resistance element 2 and the on-substrate magnetic body 3 are disposed on the main surface of the substrate 1. On the other hand, the magnetic field detection device 200 has a structure which further includes externally-mounted magnetic bodies 8 each extending in a direction perpendicular to main surfaces of on-substrate magnetic bodies 30 disposed on a substrate 10.

That is, the magnetic field detection device 200 shown in FIG. 5 includes: three on-substrate magnetic bodies 30 which are arranged in a direction of a side of the substrate 10 and are independent from each other; three externally-mounted magnetic bodies 8 each extending in the direction perpendicular to the main surfaces of the respective on-substrate magnetic bodies 30 to be magnetically connected to the respective on-substrate magnetic bodies 30; and a plurality of magneto-resistance elements 20 each disposed between the on-substrate magnetic bodies 30 on the substrate 10. The magnetic field detection device 200 has a structure in which the externally-mounted magnetic bodies 8 are used as an external magnetic circuit 5. Note that, for example, a spin-valve type TMR element is used as the magneto-resistance element 20.

Here, the on-substrate magnetic body 30 and the externally-mounted magnetic body 8 are electrically insulated from each other by, for example, an insulating film which is formed of an inorganic material such as alumina, a silicon nitride film, and a silicon oxide film or an organic material such as a polyimide resin and an epoxy resin, and has a thickness of 0.01 to 10 μm. In addition, the insulating film has a structure so as to cover the on-substrate magnetic body 30 and the magneto-resistance element 2 as a protective film. Note that there may be employed a structure in which the insulating film is not provided so as to bring the on-substrate magnetic body 30 and the externally-mounted magnetic body 8 into contact with each other.

Materials for the on-substrate magnetic body 30 and the externally-mounted magnetic body 8 are not limited as long as the materials have high permeability, and include CoFe, permalloy, and steel sheet. The steel sheet is preferred in terms of cost, but a material having high initial permeability, such as permalloy, is desirable in order to improve detection sensitivity in a low magnetic field.

Further, thicknesses of the on-substrate magnetic body 30 and the externally-mounted magnetic body 8 are designed so as not to cause magnetic saturation under a use condition. For example, in a case of detecting a magnetic field of approximately 10 mT (tesla) at most, the thickness of the on-substrate magnetic body 30 is desirably equal to or more than 10 μm when a steel sheet having a thickness of 1 mm is used as the externally-mounted magnetic body 8.

Here, the externally-mounted magnetic bodies 8 each have, on one side surface thereof, a cut-out having a width corresponding to a thickness of the substrate 10, and have a structure in which the substrate 10 is fitted into each cut-out so that the on-substrate magnetic body 30 corresponds thereto one by one. In addition, a depth of the cut-out of the externally-mounted magnetic body 8 is set in accordance with a length of the on-substrate magnetic body 30 so that the external magnetic field is guided to the on-substrate magnetic body 30 through the externally-mounted magnetic body 8 to effectively converge on the on-substrate magnetic body 30.

Further, though omitted in FIG. 5, the three externally-mounted magnetic bodies 8 desirably have a structure in which the three externally-mounted magnetic bodies 8 are incorporated into, for example, a component made of a resin so that the respective cut-outs thereof are arranged in line and the substrate 10 is fitted thereinto without difficulty.

FIG. 6 is a perspective view of the substrate 10 in which the magneto-resistance elements 20 and the on-substrate magnetic bodies 30 which form the magnetic field detection device 200 are disposed, which is viewed from above of a main surface thereof. As shown in FIG. 6, in the three on-substrate magnetic bodies 30, the on-substrate magnetic body 30 (designated as 301 for convenience) positioned in a center thereof is substantially T-shaped in plan view, and the on-substrate magnetic bodies 30 (designated as 302 and 303 for convenience) each are substantially L-shaped in plan view. Note that, in a case where the L-shape of the on-substrate magnetic body 302 is set as a reference, the on-substrate magnetic body 303 is disposed so that a leg portion in the L shape thereof indicates a direction reverse to that of the on-substrate magnetic body 302 and that a top portion of the on-substrate magnetic body 301 is on a lower side thereof.

The on-substrate magnetic bodies 301 to 303 are disposed so that a top portion 301B in the T-shape of the on-substrate magnetic body 301 and leg portions 302B and 303B in the L-shape of the on-substrate magnetic bodies 302 and 303, respectively, are arranged in line. In addition, the externally-mounted magnetic bodies 8 are arranged in a direction perpendicular to main surfaces of main body portions 301A, 302A, and 302A of the on-substrate magnetic bodies 301 to 303, respectively, thereabove, which is omitted in FIG. 6.

Two magneto-resistance elements 20 are provided in parallel on the substrate 10 between the T-shaped top portion 301B of the on-substrate magnetic body 301 and the L-shaped leg portion 302B of the on-substrate magnetic body 302 and also between the T-shaped top portion 301B of the on-substrate magnetic body 301 and the L-shaped leg portion 303B of the on-substrate magnetic body 303.

Note that the T-shaped top portion 301B of the on-substrate magnetic body 301 and the L-shaped leg portions 302B and 303B of the on-substrate magnetic bodies 302 and 303, respectively, have a contour shape with a gentile curvature.

Accordingly, the external magnetic field is guided to the on-substrate magnetic bodies 30 through the externally-mounted magnetic bodies 8 (FIG. 5) to converge on the T-shaped top portion 301B of the on-substrate magnetic body 301 and the L-shaped leg portions 302B and 303B of the on-substrate magnetic bodies 302 and 303, respectively. Then, the external magnetic field has a magnetic flux density higher than a magnetic flux density when entering the externally-mounted magnetic bodies 8 and is output from the top portion 301B and the leg portions 302B and 303B, thereby being applied to the magneto-resistance elements 20.

The magneto-resistance elements 20 are arranged in the vicinity of the top portion 301B and the leg portions 302B and 303B of the on-substrate magnetic bodies 301 to 303, respectively, with the result that a magnetic field stronger than the external magnetic field can be applied to the magneto-resistance elements 20. Accordingly, the sensitivity of the magnetic field detection device 200 can be increased.

B-2. Device Operation

As described above, the magnetic field detection device 200 has the structure in which the external magnetic field is guided to the on-substrate magnetic bodies 30 by the three externally-mounted magnetic bodies 8, and it is possible to apply the magnetic field detection device 200 having the above-mentioned structure to a rotation sensor.

That is, as shown in FIG. 5, the magnetic field detection device 200 is disposed in proximity to a main surface of a magnetization rotor 40 (with an interval so as not be in contact therewith) so that side surfaces (side surfaces opposite to the side surfaces into which the substrate 10 is fitted) of the three externally-mounted magnetic bodies 8 are perpendicular to a main surface of the magnetization rotor 40. Accordingly, rotation of the magnetization rotor 40 can be detected.

In the magnetization rotor 40, there are alternately provided magnetic poles 41 magnetized to a north pole and magnetic poles 42 magnetized to a south pole along a rotation direction B (indicated by an arrow) of the rotor. The rotation of the magnetization rotor 40 can be detected based on a positional relationship between the three externally-mounted magnetic bodies 8 and the magnetic poles 41 and 42.

More specifically, in FIG. 5, in a case where the magnetic poles 41 and 42 of the magnetization rotor 40 are in proximity to the externally-mounted magnetic body 8 (designated as 82 for convenience) positioned on the left and the externally-mounted magnetic body 8 (designated as 83 for convenience) positioned on the right with respect to the center externally-mounted magnetic body 8 (designated as 81 for convenience), respectively, a line of magnetic force emitted from the magnetic pole 41 serving as the north pole enters the externally-mounted magnetic body 82, and is applied to the magneto-resistance elements 20 through the externally-mounted magnetic body 82 and the on-substrate magnetic body 302 magnetically coupled with the externally-mounted magnetic body 82. Then, the line of magnetic force reaches the magnetic pole 42 serving as the south pole of the magnetization rotor 40 via the externally-mounted magnetic body 81 magnetically coupled with the on-substrate magnetic body 301. On this occasion, assuming that a magnetization direction of a fixed layer of the magneto-resistance element 20 is A (direction toward the externally-mounted magnetic body 81 from the externally-mounted magnetic body 82), a magnetization direction of a free layer is the same as the magnetization direction A of the fixed layer. In such a case, a tunnel magneto-resistance of the magneto-resistance element 20 decreases, and thus a tunnel current increases, whereby an output of the magneto-resistance element 20, which corresponds to the tunnel current, can be obtained.

In this case, the magneto-resistance elements 20 are disposed so that the magnetization direction of the fixed layer is in parallel or anti-parallel to the rotation direction of the magnetization rotor 40, which makes a tunnel magneto-resistance effect noticeable.

Note that in a case where the magnetic poles 42 and 41 of the magnetization rotor 40 are in proximity to the externally-mounted magnetic bodies 82 and 81, respectively, the magnetization direction of the free layer of the magneto-resistance element 20 is reverse to the magnetization direction A of the fixed layer thereof, whereby the tunnel magneto-resistance is increased.

Meanwhile, in a case where the same magnetic poles of the magnetization rotor 40 are in proximity to the externally-mounted magnetic bodies 82 and 81, the state is such that the magnetic field is not applied in the direction in parallel and anti-parallel to the magnetization direction of the fixed layer.

In this manner, with the structure in which the externally-mounted magnetic bodies 8 are used to take in the external magnetic field, a magnetic field distribution in the vicinity of the magneto-resistance elements 20 is substantially determined in accordance with the arrangement of the on-substrate magnetic bodies 30 even in a case where arrangement positions of the externally-mounted magnetic bodies 8 are deviated to some extent. In addition, the on-substrate magnetic body 30 has extremely high positional accuracy as has been described in the first embodiment. Accordingly, there occurs no deviation in sensitivity due to a positional deviation of the externally-mounted magnetic body 8. For this reason, a mounting margin of the externally-mounted magnetic body 8 is increased in the magnetic field detection device 200, and thus positional adjustment becomes substantially unnecessary.

Further, arrangement is made so that the magnetization direction of the fixed layer of the magneto-resistance element 20 is substantially perpendicular to a rotation axis of the rotor, that is, arrangement is made so that the magnetization direction of the fixed layer is in a direction parallel or anti-parallel to the rotation direction of the magnetization rotor 40, with the result that output sensitivity of the magneto-resistance element 20 to changes in magnetic field can be increased. Accordingly, an output can be improved.

FIG. 7 shows, in a case where arrangement is made so that the magnetization directions of the free layer and the fixed layer are orthogonal to each other, a change characteristic of a tunnel magneto-resistance (element resistance Rm) of the magneto-resistance element 20 when a strength and a direction of the magnetic field applied to the magneto-resistance element 20 are changed. In FIG. 7, a horizontal axis and a vertical axis represent the strength of the magnetic field and the element resistance, respectively. In addition, the maximum value of the element resistance is represented by Rmax, the minimum value of the element resistance is represented by Rmin, a difference between the maximum resistance value Rmax and the minimum resistance value Rmin is represented by ΔR, the magnetic field indicating the maximum resistance value Rmax is represented by +Hk, and the magnetic field indicating the minimum resistance value Rmin is represented by −Hk.

In addition, in the characteristic diagram, a segment a shows a characteristic when the magnetic poles 41 and 42 of the magnetization rotor 40 are in proximity to the externally-mounted magnetic bodies 82 and 81, respectively. A segment b shows a characteristic when the magnetic poles 42 and 41 of the magnetization rotor 40 are in proximity to the externally-mounted magnetic bodies 82 and 81, respectively. A segment c shows a characteristic when the same magnetic poles of the magnetization rotor 40 are in proximity to the externally-mounted magnetic bodies 82 and 81.

The element resistance changes in proportion to the applied magnetic field as shown in FIG. 7, and thus it is possible to detect, when the direction and magnitude of the magnetic field applied to the magneto-resistance element 20 change correspondingly to the rotation of the magnetization rotor 40, those changes as changes in element resistance of the magneto-resistance element 20.

Here, any number of the magneto-resistance elements 20 may be provided on the substrate 10, and more preferably, four magneto-resistance elements 20 are provided on the substrate 10 as shown in FIG. 6 and are electrically connected to each other so as to form a Wheatstone bridge. Accordingly, noises (common mode noises) superimposed on the Wheatstone bridge with the same phase are canceled each other, with the result that noise resistance of the magnetic field detection device 200 can be increased. Further, a plurality of magneto-resistance elements 20 which have equal temperature characteristics are used, and a difference between neutral potentials generated by a difference in magnetic field applied thereto, whereby an output is determined based on a relative ratio of the resistance of the magneto-resistance element, not based on a resistance itself. Accordingly, temperature drift resistance of the magnetic field detection device 200 can be increased.

In FIG. 6, description is given provided that four magneto-resistance elements 20 are provided. However, the respective magneto-resistance elements 20 may have a structure in which a plurality of more minute magneto-resistance elements are connected in series.

This structure is described with reference to FIG. 8 and FIG. 9.

FIG. 8 is a plan view in a case where the magneto-resistance element 20 is composed of a plurality of magneto-resistance elements 201, in which a region "X" surrounded by a dashed line corresponds to the magneto-resistance element 20.

FIG. 9 is a diagram showing a relationship between a free layer FL, a fixed layer PL, and a wiring layer WR in the magneto-resistance element 201. As shown in FIG. 9, two free layers FL are disposed in parallel as individually independent patterns on one fixed layer PL, and four fixed layers PL are arranged in line along an arrangement direction of the free layers FL, whereby there is provided a structure in which eight free layers FL are arranged in line. Between the adjacent fixed layers PL, the free layers FL which are opposed and adjacent to each other are electrically connected to each other by the wiring layer WR which is disposed so as to cover top portions thereof, whereby there is provided a structure in which eight free layers FL are electrically connected in series.

With such a structure, breakdown voltage of the magneto-resistance element 20 can be increased.

Figure 10:
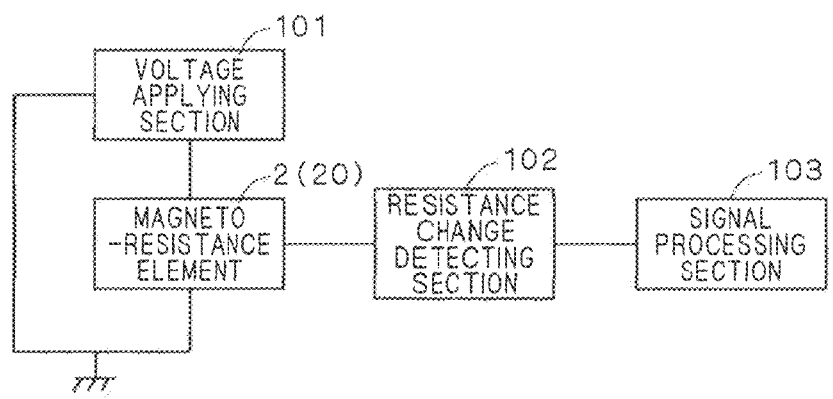
FIG. 10 is a block diagram showing a structure of a signal detection circuit of the magnetic field detection device.

Here, referring to FIG. 10, a structure example of a signal detection circuit of the magnetic field detection device is described. Note that the signal detection circuit shown in FIG. 10 is applicable to any of the magnetic field detection device 100 described with reference to FIG. 1 and the magnetic field detection device 200 described with reference to FIG. 5.

The magneto-resistance element 2 (or 20) is connected with a voltage applying section 101 and a resistance change detecting section 102, and the resistance change detecting section 102 is connected with a signal processing section 103. When a predetermined voltage is applied between the upper electrode and the lower electrode of the magneto-resistance element 2 (or 20), a current corresponding to a element resistance at that time flows, whereby it is possible to detect the current by the resistance change detecting section 102. Then, the signal processing section 103 generates and outputs a signal based on an output of the resistance change detecting section 102, with the result that an output corresponding to the magnetic field applied externally can be obtained.

Note that, as described above, in the case where four magneto-resistance elements 20 are connected in a Wheatstone bridge manner, the voltage applying section 101 supplies a voltage to be applied to the Wheatstone bridge, and the resistance change detecting section 102 detects the output from the Wheatstone bridge.

When the signal detection circuit shown in FIG. 10 is provided on the main surfaces of the substrate 1 (FIG. 1) and the substrate 10 (FIG. 10), a signal path is shortened, whereby it is possible to form a magnetic field detection device which is more resistant to noise.

Note that the signal detection circuit shown in FIG. 10 can adopt a structure in which the signal detection circuit is formed in advance on the substrate 1 (or 10) as a semiconductor integrated circuit, and the magneto-resistance element 2 (or 20) and the on-substrate magnetic body 3 (or 30) is formed thereon to be stacked. It goes without saying that there can be adopted a method of mounting a signal detection circuit formed separately onto any main surface of the substrate 1 (or 10) together with the semiconductor substrate.

B-3. Modification

Note that as to the magnetic field detection device 200 described above, the example in which the present invention is applied to the rotation sensor which detects the rotation of the magnetization rotor 40 is described. However, it is needless to say that the present invention is also applicable to a rotation sensor which detects, based on fluctuations in magnetic field, a rotation of a gear with the use of the gear of the magnetic body and a magnet on a sensor side.

Moreover, it is needless to say that the present invention is also applicable to a position sensor for detecting linear motion and rotation angle and to a current sensor which detects a magnetic field generated due to a current to detect the current.

C. Third Embodiment

C-1. Device Structure

Figure 11:
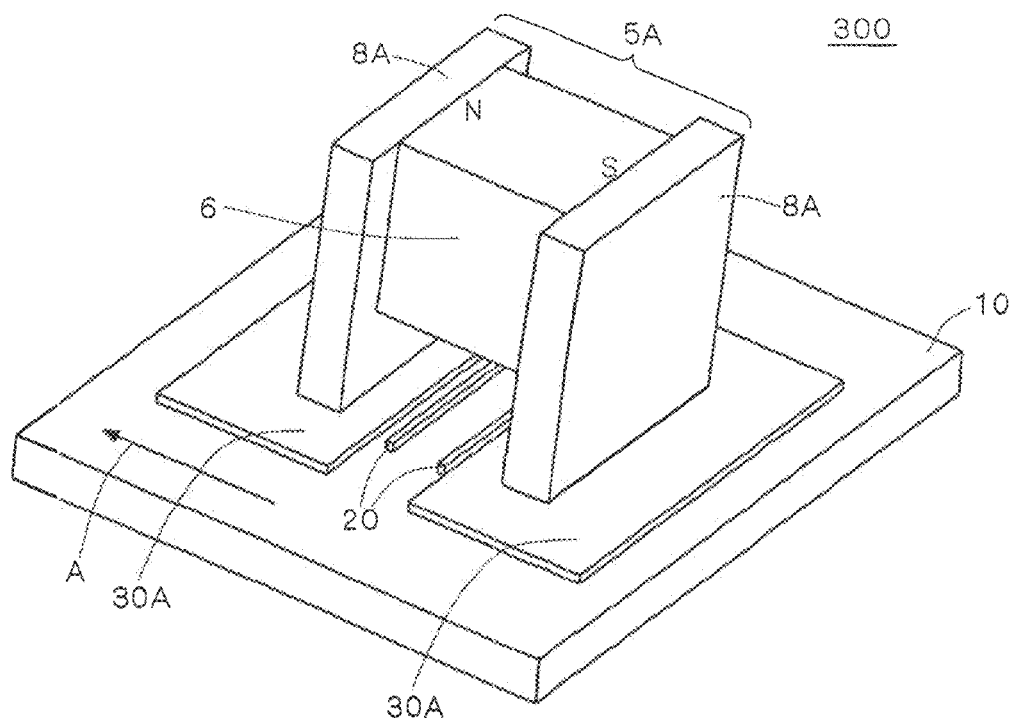
FIG. 11 is a perspective view showing a structure of a magnetic field detection device according to a third embodiment of the present invention.

FIG. 11 shows a structure of a magnetic field detection device 300 according to a third embodiment of the present invention. The magnetic field detection device 100 according to the first embodiment, which is shown in FIG. 1, has the structure in which the magneto-resistance element 2 and the on-substrate magnetic body 3 are disposed on the main surface of the substrate 1. On the other hand, the magnetic field detection device 300 has a structure which further includes two plate-like externally-mounted magnetic bodies 8A individually extending in a direction perpendicular to main surfaces of two on-substrate magnetic bodies 30A disposed on the substrate 10, and a permanent magnet 6 which magnetically couples the two externally-mounted magnetic bodies 8A. The externally-mounted magnetic bodies 8A and the permanent magnet 6 form an external magnetic circuit 5A. Note that the permanent magnet 6 is magnetized so that surfaces thereof being in contact with the two externally-mounted magnetic bodies 8A are the north pole and the south pole, and in the example of FIG. 11, the surface in a magnetization direction A (indicated by an arrow) of the fixed layer of the magneto-resistance element 20 and the surface in a direction opposite thereto are the north pole and the south pole, respectively. In the above-mentioned structure, the direction of the magnetic field is opposite to the magnetization direction A of the fixed layer, but when the structure is made so that the directions of the magnetic poles of the permanent magnet 6 are reversed, there can be obtained a magnetic field detection device in which the direction of the magnetic field and the magnetization direction A of the fixed layer are the same.

Further, on the substrate 10 in a position sandwiched between the two on-substrate magnetic bodies 30A, two magneto-resistance elements 20 are each disposed in the vicinity of long sides of the on-substrate magnetic bodies 30A which are rectangular in plan view so as to extend along the long sides.

As a material for the externally-mounted magnetic body 8A, there may be used a material as same as that for the externally-mounted magnetic body 8 described in the second embodiment, or a cheap material such as a steel sheet.

As the permanent magnet 6, there may be used a rear-earth magnet such as a samarium-cobalt magnet and a neodymium magnet, or a ferrite magnet.

C-2. Device Operation

In the magnetic field detection device 300 described above, the magnetic field output from the north pole of the permanent magnet 6 crosses the magneto-resistance element 20 disposed on the substrate 10 via the externally-mounted magnetic body 8A and the on-substrate magnetic body 30A, and reaches the south pole of the permanent magnet 6 again via the on-substrate magnetic body 30A and the externally-mounted magnetic body 8A. In this manner, the structure is made such that the magnetic field generated from the permanent magnet 6 substantially affects only an inside of the external magnetic circuit 5A and the magneto-resistance elements 20 provided on the substrate 10.

For example, in a case where the spin-valve type TMR element having resistance characteristic as shown in FIG. 7 is used as the magneto-resistance element 20, the resistance thereof indicates the value Rmin or the value Rmax when sufficiently large bias magnetic field is applied externally. The minimum value Rmin and the maximum value Rmax of the TMR element change when temperature changes, but a change of the magnetic field Hk which provides those values is extremely small. For this reason, it is possible to correct, with high accuracy, changes in resistance of the TMR element due to temperature by referring to values of the minimum resistance value Rmin and the maximum resistance value Rmax.

That is, when the resistance value of the magneto-resistance element 20 is represented by Rd, from FIG. 7, Rd=Rmin+(Rmax−Rmin)(H/|Hk|−½), and when this is rearranged, (Rd−Rmin)/(Rmax−Rmin)=(H/|Hk|)−½.

In this manner, the measurement value H of the external magnetic field can be uniquely obtained from the minimum resistance value Rmin, the maximum resistance value Rmax, and the measured resistance value Rd and magnetic field Hk. Accordingly, even in a case where temperature of the TMR element changes, it is possible to obtain a measurement result of the external magnetic field, which is subjected to temperature control, when the minimum resistance value Rmin and the maximum resistance value Rmax at the relevant temperature can be obtained.

Note that, in order to obtain the maximum resistance value Rmax, there may be used a magnetic field detection device such as the magnetic field detection device 300 shown in FIG. 11 in which the direction of the magnetic field is reverse (anti-parallel) to the magnetization direction A of the fixed layer. Meanwhile, in order to obtain the minimum resistance value Rmin, there may be used a magnetic field detection device in which the direction of the magnetic field is the same as (parallel to) the magnetization direction A of the fixed layer.

For example, a part of the plurality of TMR elements formed so as to be substantially the same on the substrate 10 is used in the magnetic field detection device 300 shown in FIG. 11, and the magnetic field is applied from the external magnetic circuit 5A, thereby obtaining the minimum resistance value Rmin and the maximum resistance value Rmax for reference. The remaining TMR elements are used in the magnetic field detection device 100 shown in FIG. 1 or the magnetic field detection device 200 shown in FIG. 5, thereby measuring the external magnetic field (in actuality, resistance value of the TMR element). Then, the measurement value H of the external magnetic field is calculated based on the resistance value of the TMR element which is obtained in the determination, and the minimum resistance value Rmin and the maximum resistance value Rmax (resistance values at the temperature when the external magnetic field is measured) obtained by the magnetic field detection device 300, with the result that the measurement value H of the external magnetic field, which is subjected to temperature correction with high accuracy, can be obtained.

In this manner, the magnetic field detection device 300 is used in combination with the magnetic field detection device 100 (FIG. 1) or 200 (FIG. 5), with the result that the temperature correction can be easily performed on the measured value of the external magnetic field with high accuracy.

C-3. Modification 1

As described above, in the magnetic field detection device 300, it is necessary to prepare two types of magnetic field detection devices which have different directions of magnetic poles of the permanent magnet 6 for obtaining the minimum resistance value Rmin and the maximum resistance value Rmax. Meanwhile, in the magnetic field detection device 400 shown in FIG. 12, the minimum resistance value Rmin and the maximum resistance value Rmax can be obtained by one type of magnetic field detection device.

Figure 12:
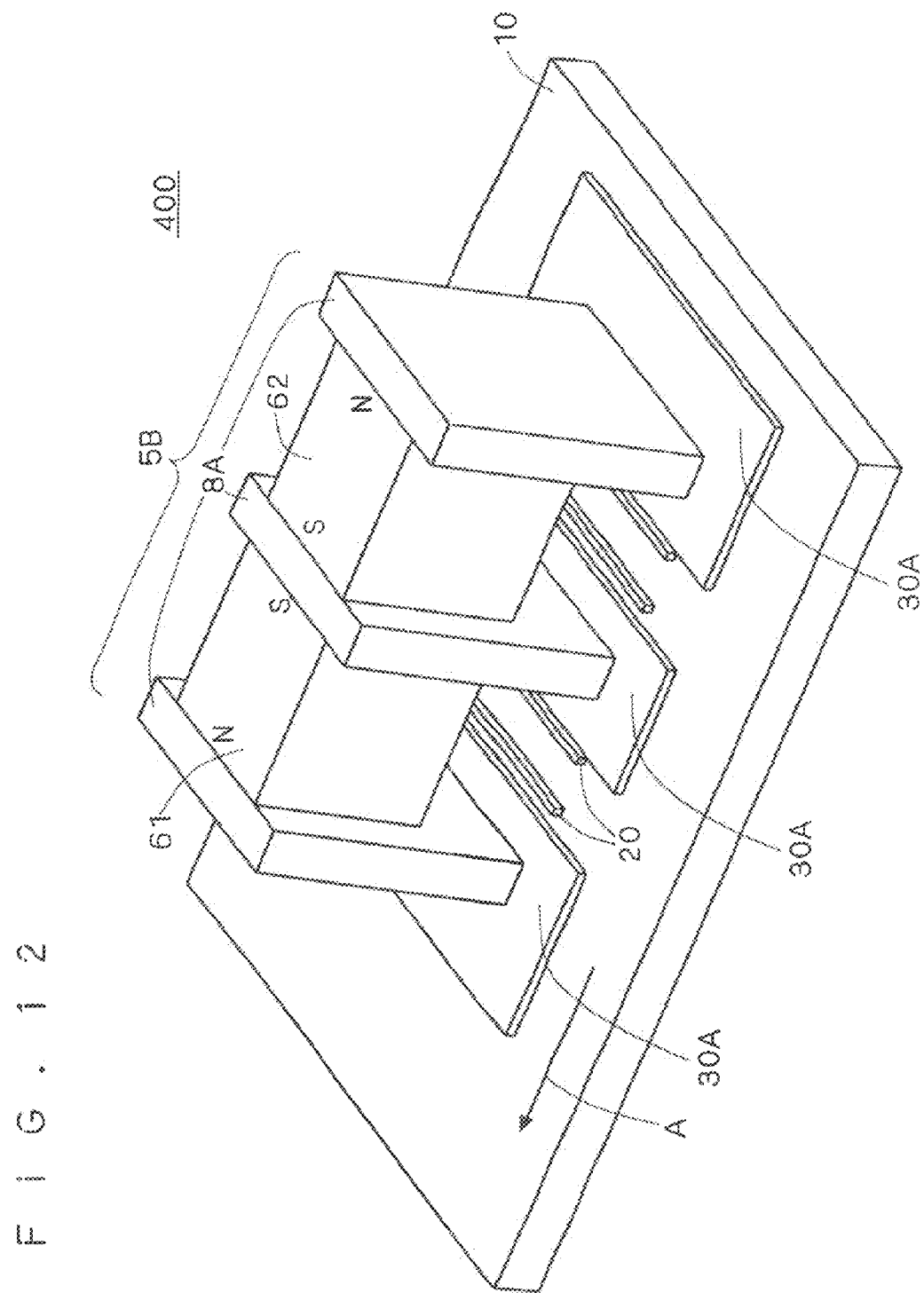
FIG. 12 is a perspective view showing a structure of Modification 1 of the magnetic field detection device according to the third embodiment of the present invention.

That is, the magnetic field detection device 400 shown in FIG. 12 includes three externally-mounted magnetic bodies 8A each extending in a direction perpendicular to main surfaces of three on-substrate magnetic bodies 30A which are disposed in parallel with intervals, and the three externally-mounted magnetic bodies 8A are disposed in line so that main surfaces thereof are opposed to each other. The magnetic field detection device 400 has a structure which includes two permanent magnets 61 and 62 which magnetically couples the three externally-mounted magnetic bodies 8A with each other. Note that the same components as those of the magnetic field detection device 300 shown in FIG. 11 are denoted by the same reference symbols, and overlapping descriptions are omitted.

Figure 13:
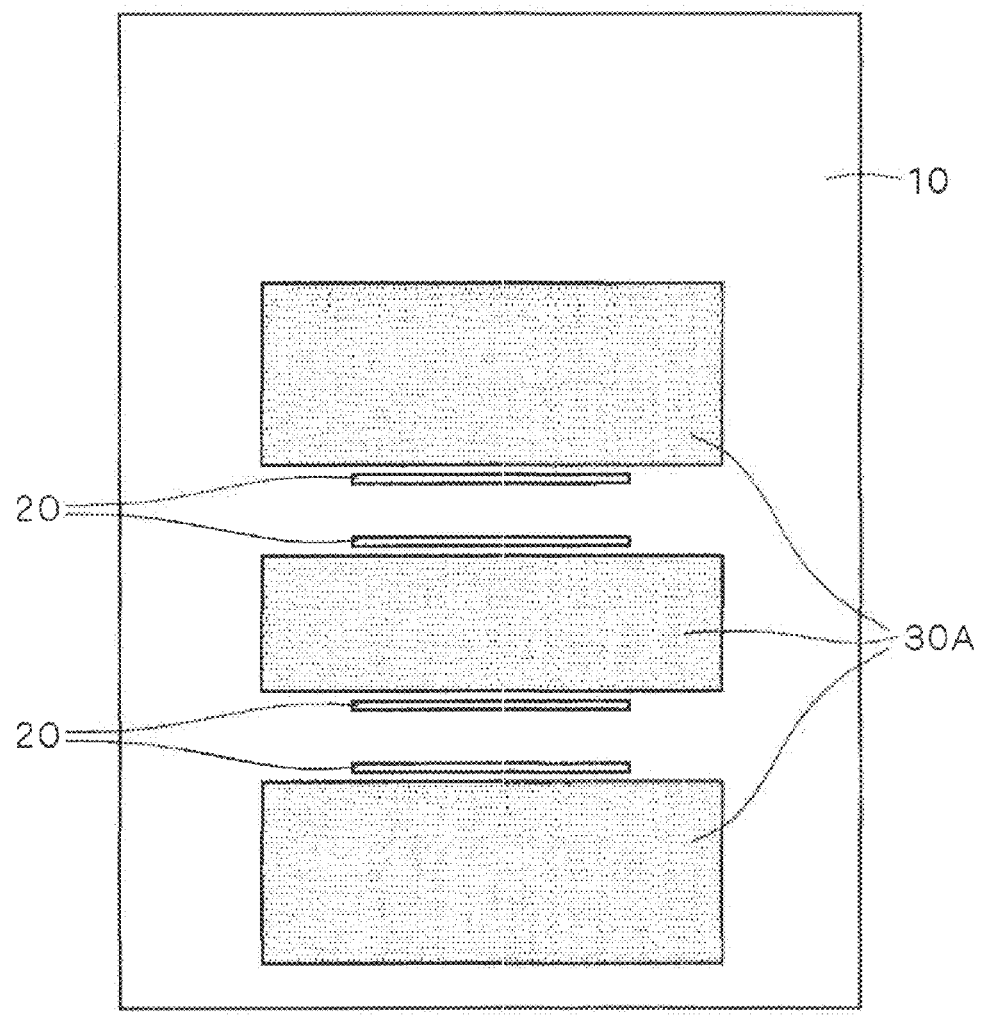
FIG. 13 is a plan view showing a structure of a substrate of Modification 1 of the magnetic field detection device according to the third embodiment of the present invention.

FIG. 13 is a plan view of the substrate 10 viewed from above the main surface thereof. As shown in FIG. 13, on the substrate 10 between the on-substrate magnetic bodies 30A, there are each disposed two magneto-resistance elements 20 in the vicinity of the long sides of the on-substrate magnetic bodies 30A having a rectangular shape in plan view, so as to extend along the long sides. Note that the magneto-resistance element 20 may be the spin-valve type TMR element or GMR element.

The externally-mounted magnetic bodies 8A and the permanent magnets 61 and 62 form an external magnetic circuit 5B. The permanent magnet 61 is magnetized so that a surface being in contact with the center externally-mounted magnetic body 8A and a surface being in contact with the externally-mounted magnetic body 8A positioned on the left of FIG. 13 are magnetized to the south pole and the north pole, respectively, whereas the permanent magnet 62 is magnetized so that a surface being in contact with the center externally-mounted magnetic body 8A and a surface being in contact with the externally-mounted magnetic body 8A positioned on the right side of FIG. 13 are magnetized to the south pole and the north pole, respectively.

With the structure as described above, the permanent magnet 61 generates a magnetic field in a direction opposite (anti-parallel) to the magnetization direction A (indicated by the arrow) of the fixed layer of the magneto-resistance element 20, and the permanent magnet 62 generates a magnetic field in the same (parallel) direction to the magnetization direction A of the fixed layer of the magneto-resistance element 20. Accordingly, it is possible to obtain the minimum resistance value Rmin and the maximum resistance value Rmax by applying different bias magnetic fields to the magneto-resistance elements 20 only by the magnetic field detection device 400.

C-4. Modification 2

Figure 14:
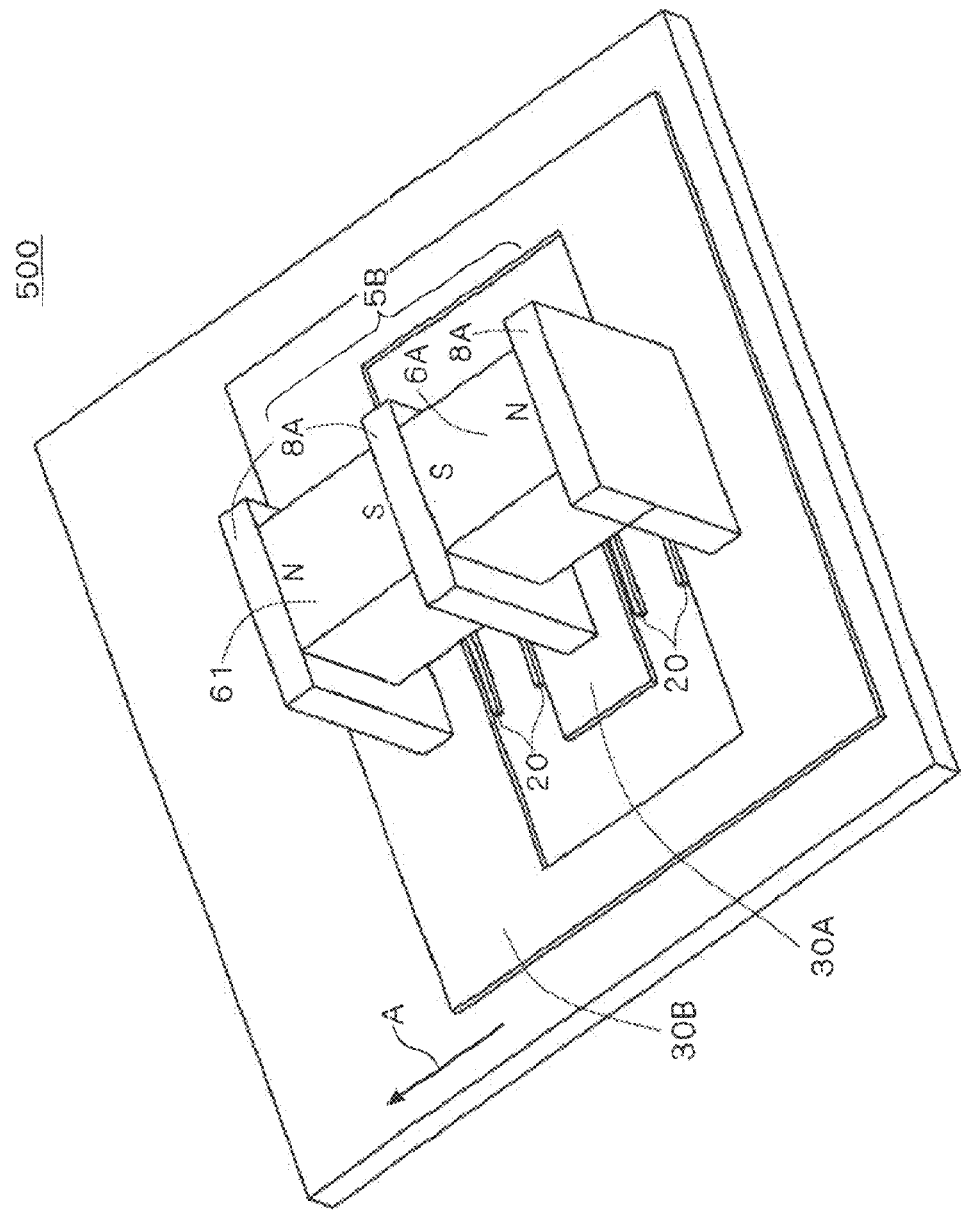
FIG. 14 is a perspective view showing a structure of Modification 2 of the magnetic field detection device according to the third embodiment of the present invention.

As the structure with which the minimum resistance value Rmin and the maximum resistance value Rmax can be obtained by one type of magnetic field detection device, there can be adopted a structure of a magnetic field detection device 500 shown in FIG. 14.

That is, in the magnetic field detection device 500 shown in FIG. 14, the on-substrate magnetic body 30A having a rectangular shape in plan view is set as a center, and a loop-like on-substrate magnetic body 30B is disposed therearound with an interval. Between the on-substrate magnetic bodies 30A and 30B, there are disposed, in each of two gaps in a direction parallel to short sides of the on-substrate magnetic body 30A, two magneto-resistance elements 20 in the vicinity of the long sides of the on-substrate magnetic body 30A so as to extend along the long sides.

Figure 15:
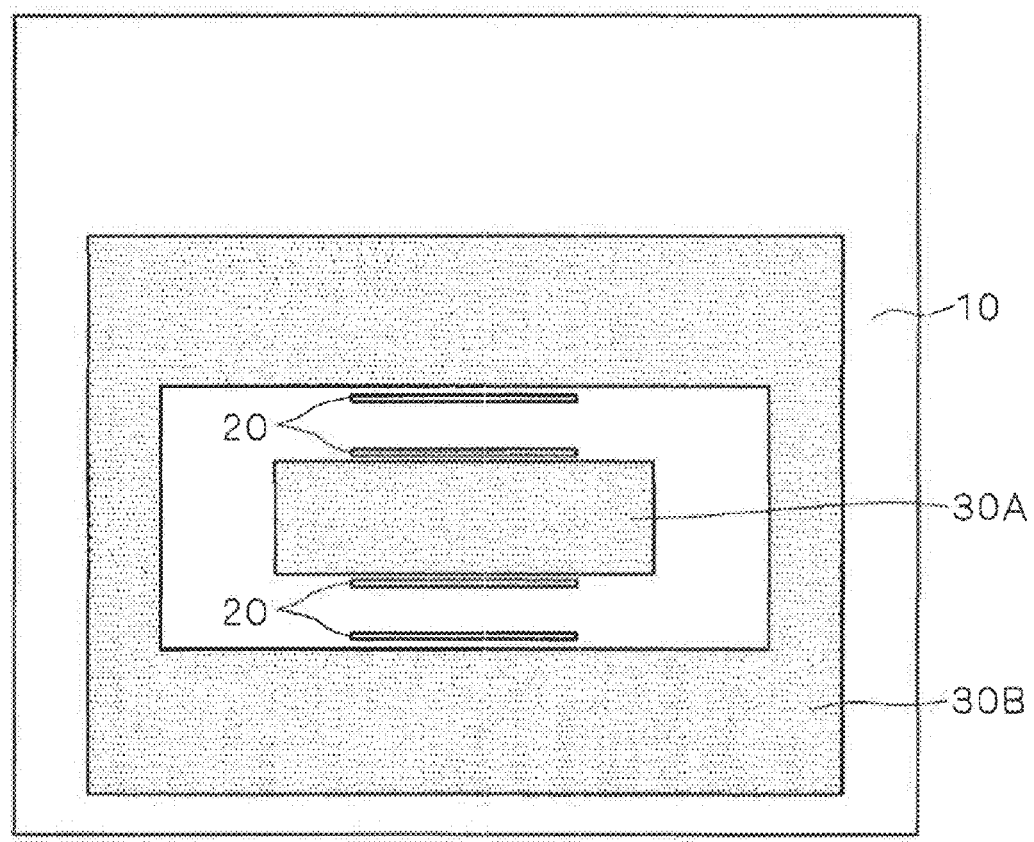
FIG. 15 is a plan view showing a structure of a substrate of Modification 2 of the magnetic field detection device according to the third embodiment of the present invention.

In addition, the magnetic field detection device 500 includes the externally-mounted magnetic body 8A extending in a direction perpendicular to the main surface of the on-substrate magnetic body 30A, and two externally-mounted magnetic bodies 8A extending in a direction perpendicular to a main surface of the on-substrate magnetic body 30B so as to sandwich the magnetic body 8A therebetween. The three externally-mounted magnetic bodies 8A are disposed in line so that respective main surfaces thereof are opposed to each other. Further, the magnetic field detection device 500 includes two permanent magnets 61 and 62 which magnetically couple the three externally-mounted magnetic bodies 8A. FIG. 15 is a plan view of the substrate 10 viewed from above the main surface thereof.

The externally-mounted magnetic bodies 8A and the permanent magnets 61 and 62 form the external magnetic circuit 5B. The permanent magnet 61 is magnetized so that the surface being in contact with the center externally-mounted magnetic body 8A and the surface being in contact with the externally-mounted magnetic body 8A positioned on the left side of FIG. 14 are the south pole and the north pole, respectively, whereas the permanent magnet 62 is magnetized so that the surface being in contact with the center externally-mounted magnetic body 8A and the surface being in contact with the externally-mounted magnetic body 8A positioned on the right side of FIG. 13 are magnetized to the south pole and the north pole, respectively.

With the structure as described above, the permanent magnet 61 generates the magnetic field in a direction opposite (anti-parallel) to the magnetization direction A (indicated by the arrow) of the fixed layer of the magneto-resistance element 20, and the permanent magnet 62 generates the magnetic field in the same (parallel) direction to the magnetization direction A of the fixed layer of the magneto-resistance element 20. Accordingly, it is possible to obtain the minimum resistance value Rmin and the maximum resistance value Rmax only by the magnetic field detection device 500.

C-5. Modification 3

Figure 16:
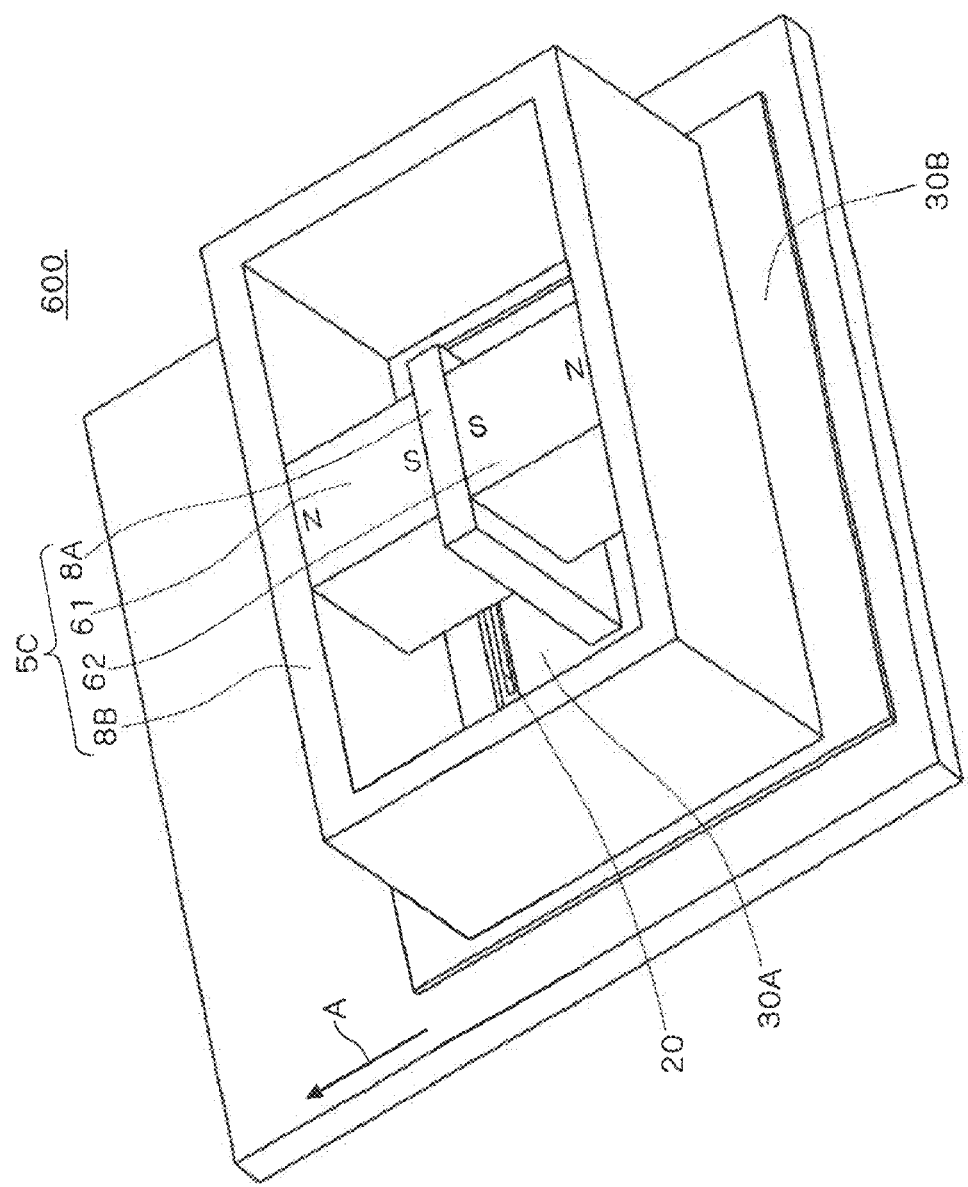
FIG. 16 is a perspective view showing a structure of Modification 3 of a magnetic field detection device according to a fourth embodiment of the present invention.

As the structure with which the minimum resistance value Rmin and the maximum resistance value Rmax can be obtained by one type of magnetic field detection device, there can be adopted a structure of a magnetic field detection device 600 shown in FIG. 16.

That is, in the magnetic field detection device 600 shown in FIG. 16, the on-substrate magnetic body 30A having a rectangular shape in plan view is set as a center, and the loop-like on-substrate magnetic body 30B is disposed therearound with an interval. Between the on-substrate magnetic bodies 30A and 30B, there is disposed, in each of the two gaps in the direction parallel to the short sides of the on-substrate magnetic body 30A, one magneto-resistance element 20 so as to extend along the long side of the on-substrate magnetic body 30A. Note that gaps between the on-substrate magnetic bodies 30A and 30B are set to be narrow so that the magneto-resistance element 20 is in proximity to both the on-substrate magnetic bodies 30A and 30B.

Figure 17:
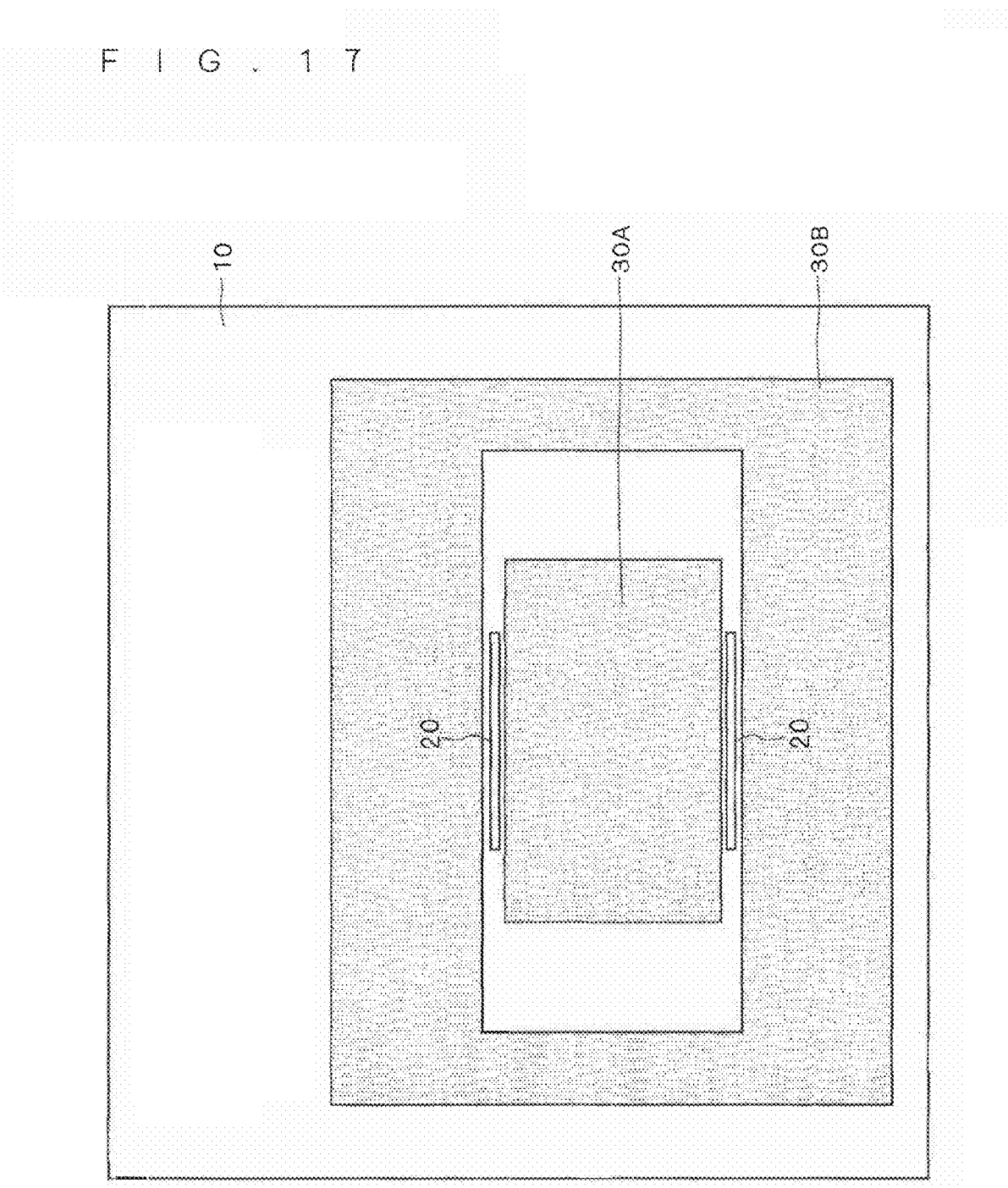
FIG. 17 is a plan view showing a structure of a substrate of Modification Example 3 of the magnetic field detection device according to the fourth embodiment of the present invention.

In addition, the magnetic field detection device 600 includes the plate-like externally-mounted magnetic body 8A extending in the direction perpendicular to the main surface of the on-substrate magnetic body 30A, a box-like externally-mounted magnetic body 8B extending in a direction perpendicular to the main surface of the on-substrate magnetic body 30B along a loop shape thereof, and two permanent magnets 61 and 62 which magnetically couple the externally-mounted magnetic body 8A and the externally-mounted magnetic body 8B. FIG. 17 shows a plan view of the substrate 10 viewed from above of the main surface thereof.

The externally-mounted magnetic bodies 8A and 8B and the permanent magnets 61 and 62 form an external magnetic circuit 5C. The permanent magnet 61 is magnetized so that a surface being in contact with the externally-mounted magnetic body 8A and a surface being in contact with a wall surface of the externally-mounted magnetic body 8B positioned on the left side of FIG. 16 are the south pole and the north pole, respectively, whereas the permanent magnet 62 is magnetized so that a surface being in contact with the center externally-mounted magnetic body 8A and a surface being in contact with a wall surface of the externally-mounted magnetic body 8B positioned on the right side of FIG. 16 are magnetized to the south pole and the north pole, respectively.

With the structure as described above, the permanent magnet 61 generates the magnetic field in a direction opposite (anti-parallel) to the magnetization direction A (indicated by the arrow) of the fixed layer of the magneto-resistance element 20, whereas the permanent magnet 62 generates the magnetic field in the same (parallel) direction to the magnetization direction A of the fixed layer of the magneto-resistance element 20. Accordingly, it is possible to obtain the minimum resistance value Rmin and the maximum resistance value Rmax only by the magnetic field detection device 600.

Moreover, when the box-like externally-mounted magnetic body 8B is used, other magneto-resistance elements can be less affected by magnetic flux leakage from the permanent magnets 61 and 62.

The magnetic field detection devices 300 to 500 for temperature correction described above are desirably provided on the same substrate on which the magnetic field detection devices 100 and 200 for external magnetic field detection, which are described with reference to FIG. 1 and FIG. 5, are provided. When the magnetic field detection devices 300 to 600 are provided on the same substrate, measurement conditions can be made the same, and further, temperature characteristics can be corrected with higher accuracy because element characteristics can be made uniform.

Note that the permanent magnets 6, 61, and 62 which are described in the third embodiment are bias magnetic field sources for applying the magneto-resistance element with a bias magnetic field, but are not limited to a permanent magnet as long as they are capable of generating the bias magnetic field, and an electromagnet may be used.

While the invention has been shown and described in detail, the foregoing description is in all aspects illustrative and not restrictive. It is therefore understood that numerous modifications and variations can be devised without departing from the scope of the invention.

The invention claimed is:

1. A magnetic field detection device, comprising:
a substrate;
at least one magneto-resistance element provided on one main surface of said substrate;
at least one on-substrate magnetic body which is provided on said one main surface or another main surface of said substrate to be on and fully supported by said one main surface or another main surface of said substrate, and is electrically insulated from said magneto-resistance element; and
an external magnetic circuit which is provided on an entering portion side of said on-substrate magnetic body, on which a magnetic field enters, and is magnetically coupled with said on-substrate magnetic body, and guides said magnetic field to said on-substrate magnetic body;
wherein:
said external magnetic circuit includes an externally-mounted magnetic body which is magnetically coupled to said main surface serving as said entering portion of said on-substrate magnetic body;
said externally-mounted magnetic body is disposed in proximity to a generation source of said magnetic field so that said magnetic field is guided to said entering portion through said externally-mounted magnetic body;
said generation source of said magnetic field comprises magnetic poles of a rotor whose side surfaces are alternately magnetized into a north pole and a south pole;
said externally-mounted magnetic body is disposed on said on-substrate magnetic body so as to extend in parallel with a rotation axis of said rotor;
said at least one magneto-resistance element includes a plurality of magneto-resistance elements; and
said plurality of magneto-resistance elements are arranged so that a magnetization direction of a fixed layer is substantially perpendicular to said rotation axis of said rotor.

2. A magnetic field detection device, comprising:
a substrate;
at least one magneto-resistance element provided on one main surface of said substrate;
at least one on-substrate magnetic body which is provided on said one main surface or another main surface of said substrate to be on and fully supported by said one main surface or another main surface of said substrate, and is electrically insulated from said magneto-resistance element; and
an external magnetic circuit which is provided on an entering portion side of said on-substrate magnetic body, on which a magnetic field enters, and is magnetically coupled with said on-substrate magnetic body, and guides said magnetic field to said on-substrate magnetic body;
wherein:
said at least one magneto-resistance element includes first and second magneto-resistance elements;
said at least one on-substrate magnetic body includes first and second on-substrate magnetic bodies;
said external magnetic circuit includes:
a first external magnetic circuit which is provided on said entering portion side of said first on-substrate magnetic body and is magnetically coupled with said first on-substrate magnetic body; and
a second external magnetic circuit which is provided on said entering portion side of said second on-substrate magnetic body and is magnetically coupled with said second on-substrate magnetic body;
said first external magnetic circuit includes:
a first externally-mounted magnetic body which is magnetically coupled to a main surface serving as said entering portion of said first on-substrate magnetic body; and
a first bias magnetic field generation source which is magnetically coupled to said first externally-mounted magnetic body;
said first magneto-resistance element is applied with a first bias magnetic field through said first externally-mounted magnetic body and said first on-substrate magnetic body;
said second external magnetic circuit includes:
a second externally-mounted magnetic body which is magnetically coupled to a main surface serving as said entering portion of said second on-substrate magnetic body; and
a second bias magnetic field generation source which is magnetically coupled to said second externally-mounted magnetic body; and
said second magneto-resistance element is applied with a second bias magnetic field through said second externally-mounted magnetic body and said second on-substrate magnetic body.

* * * * *